United States Patent
Harnden et al.

(10) Patent No.: US 7,485,498 B2
(45) Date of Patent: Feb. 3, 2009

(54) SPACE-EFFICIENT PACKAGE FOR LATERALLY CONDUCTING DEVICE

(75) Inventors: James Harnden, Hollister, CA (US); Allen K. Lam, Fremont, CA (US); Richard K. Williams, Cupertino, CA (US); Anthony Chia, Singapore (SG); Chu Weibing, Shanghai (CN)

(73) Assignee: GEM Services, Inc., San Jsoe, CA (US)

( * ) Notice: Subject to any disclaimer, the term of this patent is extended or adjusted under 35 U.S.C. 154(b) by 0 days.

(21) Appl. No.: 11/701,761

(22) Filed: Feb. 2, 2007

(65) Prior Publication Data

US 2007/0134851 A1 Jun. 14, 2007

Related U.S. Application Data

(62) Division of application No. 10/735,585, filed on Dec. 12, 2003, now Pat. No. 7,215,012.

(60) Provisional application No. 60/437,822, filed on Jan. 3, 2003.

(51) Int. Cl.
*H01L 21/44* (2006.01)
*H01L 21/48* (2006.01)
*H01L 21/50* (2006.01)

(52) U.S. Cl. .............. 438/123; 438/106; 438/111; 257/666; 257/676; 257/E21.499

(58) Field of Classification Search .......... 257/E21.499
See application file for complete search history.

(56) References Cited

U.S. PATENT DOCUMENTS

| 5,289,344 | A | * | 2/1994 | Gagnon et al. | 361/712 |
| 5,631,809 | A | * | 5/1997 | Takagi et al. | 361/820 |
| 6,710,432 | B1 | * | 3/2004 | Pasqualini | 257/676 |
| 2003/0151123 | A1 | * | 8/2003 | Huschka et al. | 257/678 |

* cited by examiner

*Primary Examiner*—Walter L Lindsay, Jr.
*Assistant Examiner*—Mohsen Ahmadi
(74) *Attorney, Agent, or Firm*—Townsend and Townsend and Crew LLP

(57) ABSTRACT

Efficient utilization of space in a laterally-conducting semiconductor device package is enhanced by creating at least one supplemental downbond pad portion of the diepad for receiving the downbond wire from the ground contact of the device. The supplemental diepad portion may occupy area at the end or side of the package formerly occupied by non-integral leads. By receiving the substrate downbond wire, the supplemental diepad portion allows a greater area of the main diepad to be occupied by a die having a larger area, thereby enhancing space efficiency of the package.

5 Claims, 7 Drawing Sheets

SPACE-EFFICIENT PACKAGE FOR LATERALLY CONDUCTING DEVICE

CROSS-REFERENCES TO RELATED APPLICATIONS

The instant nonprovisional patent application claims priority from U.S. provisional patent No. 60/437,822, filed Jan. 3, 2003 and incorporated herein by reference for all purposes.

BACKGROUND OF THE INVENTION

The present invention relates to packaging of semiconductor integrated circuits. More particularly, the invention provides a device and method including a die having a laterally conducting structure and a ground contact coupled to a certain lead frame having a novel lead configuration. Merely by way of example, the invention has been applied to power IC chips, but there may be many other applications.

In recent years, the evolution of semiconductor packaging technology, semiconductor technology, and consumer product applications have converged and led to a series of innovations influencing each other to improve the end product. This convergence began about ten years ago when metal oxide semiconductor field effect transistor (MOSFET) technology allowed for the creation of semiconductor chips or dies exhibiting sufficiently low resistance to allow them to perform useful work when mounted on ordinary personal computer (PC) boards, rather than on specialized heatsink structures. Applications ushering in this evolution away from the use of heatsinks included early hard disk drives and portable, battery powered electronic products, with whom the bulk and power consumption associated with conventional heat sinks precluded their use.

Positioning power MOSFET chips (i.e. chips having outputs that can conduct from 1 to 20 Amps, with "on" state resistances ranging from 10 mOhm to as much as 1 Ohm) in contact with a PC board rather than a heatsink represented a departure from prior concerns about heat dissipation, such that package designers were confident that new devices would exhibit sufficiently low resistance to handle the applied current, without generating more heat than could be effectively dissipated by an ordinary PC board. Once power MOSFET switches avoiding the use of heatsinks were mounted and used like other components mounted on the PC board, their packages were adapted from ones already being used for integrated circuits (ICs). The ability of these existing IC packages (such as the JEDEC registered SO, and TSSOP series) to dissipate heat from power MOSFET switches was enhanced utilizing techniques such as 1) tying together multiple pins or contacts, 2) tying pins directly to the die, and 3) fabricating lead frames from copper material exhibiting superior heat conductance. In this manner, balance was achieved between the ability of a power MOSFET package to transfer heat to the PC board, and the ability of the PC board to in turn dissipate heat received from the package.

The continued development of MOSFET and IC technology has allowed simple power MOSFET devices to evolve into power integrated circuit (PIC) devices having dies and packages of approximately the same size as power MOSFET devices. At the same time, the ever-increasing demand for products conforming to tight space requirements and high power demands (such as cell phones and portable imaging and computing products) has rendered such PIC devices highly desirable for use in any number of potential applications.

Therefore, there is a need in the art for new and improved packages for PIC devices which improve the efficient use of space, allowing a die of a maximum size to be contained within as small a package as possible.

SUMMARY OF THE INVENTION

The present invention relates to packaging of semiconductor integrated circuits. More particularly, the invention provides a device and method including a die having a laterally conducting structure and a ground contact coupled to a certain lead frame having a novel lead configuration. Merely by way of example, the invention has been applied to power MOSFET chips, but there may be many other applications. Preferably, space efficiency of a laterally-conducting semiconductor device package is enhanced by creating at least one supplemental downbond pad portion of the diepad for receiving the downbond wire from the die ground contact. The supplemental downbond pad portion may occupy space formerly taken by non-integral leads at the end or side of the package. By receiving the downbond wire, the supplemental diepad portion frees up a greater area of the main portion of the diepad to support a die having a larger area, thereby enhancing space efficiency.

An embodiment of a package for a semiconductor device in accordance with the present invention comprises a leadframe and a semiconductor die having a laterally conducting structure and a ground contact on an upper surface. The leadframe comprises a diepad in contact with a lower surface of the die, a lead separate from the diepad, and a supplemental downbond diepad portion. The supplemental downbond diepad portion projects from a main portion of the diepad, and is configured to receive a downbond wire from the ground contact.

An embodiment of a method of packaging a laterally conducting power semiconductor die in accordance with the present invention comprises providing a supplemental diepad portion to receive a downbond wire from a ground contact on an upper surface of the die, such that area of a main portion of the diepad does not need to be allocated to receive the downbond wire and can instead be occupied by the laterally conducting die.

These and other embodiments of the present invention, as well as its advantages and features, are described in more detail in conjunction with the text below and attached figures.

DESCRIPTION OF THE SPECIFIC EMBODIMENTS

The present invention relates to packaging of semiconductor integrated circuits. More particularly, the invention provides a device and method including a die having a laterally conducting structure and a ground contact coupled to a certain lead frame having a novel lead configuration. Merely by way of example, the invention has been applied to power IC chips, but there may be many other applications.

Figure 1A:
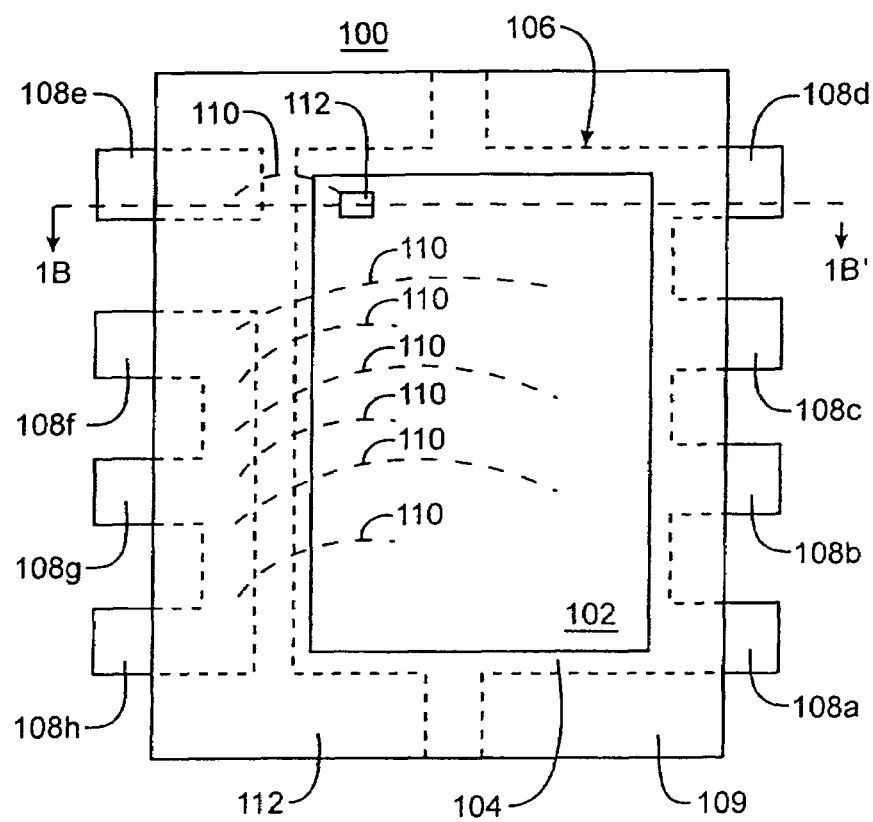
FIG. 1A is a simplified enlarged plan view of a conventional eight-lead MOSFET package.
Figure 1B:
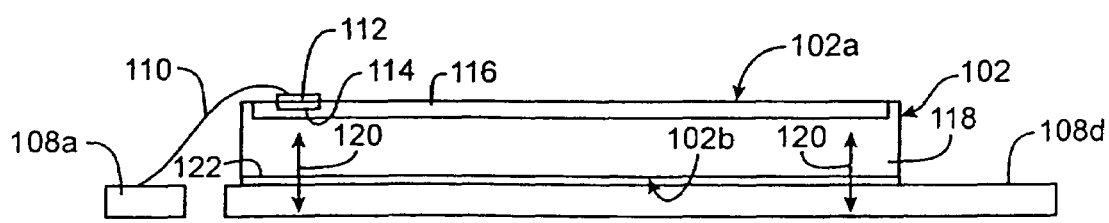
FIG. 1B is a simplified cross-sectional view of the MOSFET package of FIG. 1A.

As employed in the instant application, the term "power" generally refers to packages or dies conducting current of from 1 to 20 Amps, with "on" state resistances ranging from 10 mOhm to 1 Ohm or greater. As mentioned above, packages formerly used to house power MOSFET devices are now being adapted to house the latest generation power IC devices. For reference purposes, FIG. 1A is a simplified plan view of a conventional eight-lead power MOSFET package. FIG. 1B is a simplified cross-sectional view of the power MOSFET package of FIG. 1A, taken along the line 1B-1B'.

The conventional power MOSFET package 100 of FIGS. 1A-B comprises power MOSFET die 102 supported on diepad 104 of lead frame 106. Lead frame 106 comprises four thermally-conducting leads 108a-d integral with diepad 104, lead 108e that is not integral with diepad 104, and leads 108f-h that are also not integral with the diepad but which are integral with each other. As used herein, "integral" refers to a lead formed and projecting from the same piece of material as the diepad. An integral lead may be contrasted with a nonintegral lead not continuous with the diepad material and electrically linked to the diepad through a bondwire. Continuity of material between the diepad and an integral lead permits heat to be conducted from the operating die through the integral lead to the package exterior, where it can be effectively dissipated.

Nonintegral leads 108e-h are in electrical communication with various regions of power MOSFET die 102 through bondwires 110. Power MOSFET die 102, leadframe 106, and bondwires 110 are encapsulated within plastic packaging 109.

Power MOSFET die 102 has a bondwire connection to only a single conventional bondpad 112 on its top surface 102a, which is connected to gate 114. All of the remaining top surface 102a of MOSFET die 102 is in electrical communication with the source region 116, and thus upper die surface 102a may receive multiple bondwire connections to the source from leads 108f-h. Source bondwire attachment is not limited to individual bondpads, and bondwires may instead be attached anywhere on the top surface of the die outside of the gate wirebond pad and extreme edges of the die. The multiple source bondwires may be used to lower the impedance of the connection with the source.

The third electrical connection for MOSFET die 102 is to drain 118. This drain connection is not visible in the plan view of FIG. 1A, or accessible on the top surface 102a of die 102. Instead, connection to drain 118 of power MOSFET 102 is established through lower surface 102b of the die, which is electrically connected to package leadframe through electrically and thermally conductive adhesive 122 such as solder or silver doped epoxy.

Electrical contact to diepad 104, and hence to drain 118 of power MOSFET package 102, is established through integral leads 108a-d. In addition to providing electrical contact with the MOSFET drain, integral leads 108a-d also provide a thermal conduction pathway to remove heat generated during operation of the power MOSFET die.

Arrow 120 of FIG. 1B shows the direction of current conduction through the power MOSFET device. As indicated by arrow 120, the direction of current conduction through the power MOSFET die of FIGS. 1A-B is vertical, with drain 118 playing an active role in device operation.

In adapting power MOSFET packages such as the one shown in FIGS. 1A-B for use with a power IC device however, designers must keep in mind a number of differences between power MOSFET and PIC devices. Some of these differences are highlighted below in conjunction with FIGS. 2A-B.

Figure 2A:
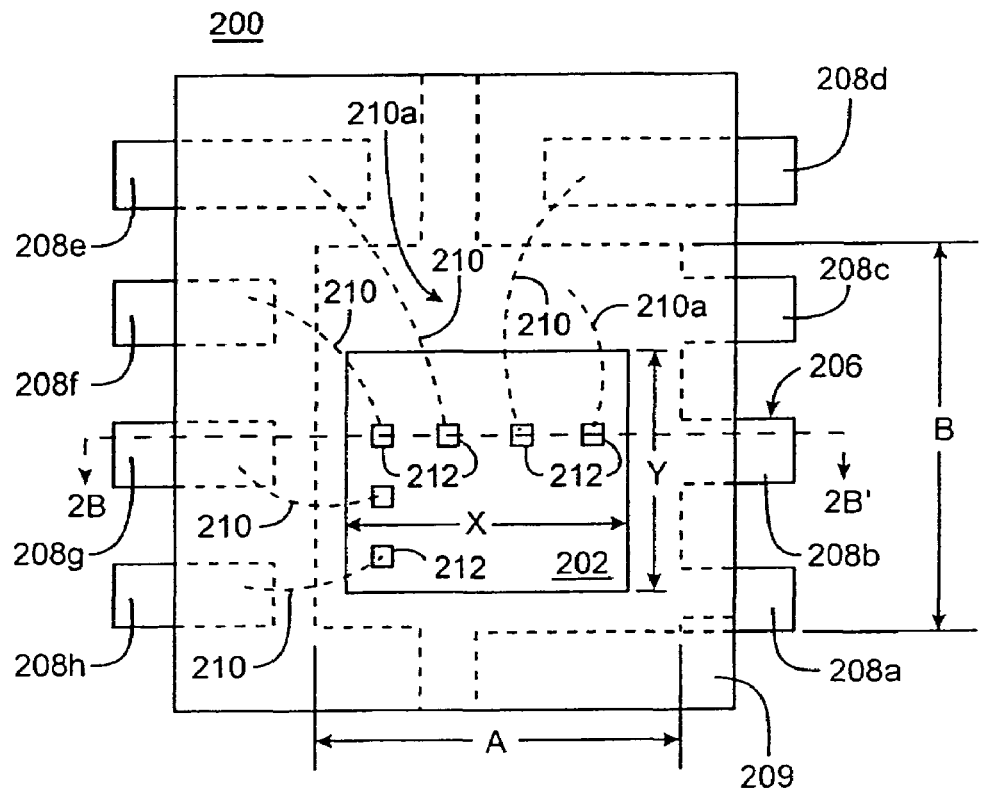
FIG. 2A is a simplified enlarged plan view of a conventional eight-lead PIC package.
Figure 2B:
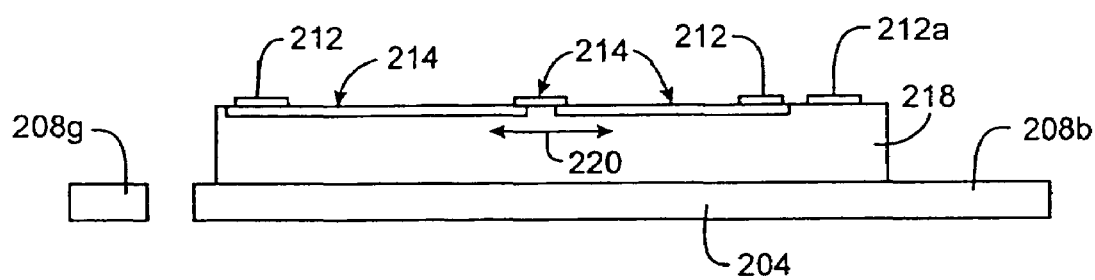
FIG. 2B is a simplified cross-sectional view of the PIC package of FIG. 2A.

FIG. 2A is a simplified enlarged plan view of a conventional eight-lead power PIC package. FIG. 2B is a simplified cross-sectional view of the PIC package of FIG. 2A, taken along the line 2B-2B'. The conventional PIC package 200 of FIGS. 2A-B comprises PIC die 202 supported on diepad 204 of lead frame 206. Lead frame 206 comprises three thermally-conducting leads 208a-c integral with diepad 204, and leads 208d-h not integral with diepad 204. Nonintegral leads 208d-h are in electrical communication with various bondpads 212 on upper surface 202a of PIC die 202 through bond wires 210. PIC die 202, leadframe 206, and bondwires 210 are encapsulated within plastic packaging 209.

Unlike the vertical conduction orientation exhibited by the MOSFET die shown in FIGS. 1A-B, PIC die 202 contains various conducting elements 214 positioned on upper surface 202a for conducting current in a lateral direction, as indicated by arrow 220. The bulk, or substrate 218 of PIC die 202 serves to provide physical support for, and electrical insulation between, the active, laterally-conducting components present on the die surface. The PIC substrate is otherwise generally not an active component of the circuit.

In low power integrated circuits, the substrate can be electrically connected, through an integrated connection internal to the die, to a voltage sufficient to bias the substrate out of conduction, thereby ensuring the desirable electrically insulative properties of the substrate. However, for power IC dies experiencing large applied currents, such an integrated substrate connection may exhibit significant electrical resistance and may likely fail to provide uniform conduction across the area of the substrate. Such an integral substrate connection would not be adequate to ensure that all of the active laterally-conducting PIC components remain electrically isolated through all high current conduction and/or potentially high transition rates within the range of operating conditions.

Therefore, the upper surface of PIC die 202 includes a specific ground (Gnd) bondpad 212a that is configured to ensure that the substrate of the PIC circuit remains grounded and does not float. Gnd bondpad 212a is connected to the diepad 204 through a specific downbond wire 210a allocated for that purpose.

Based upon the simplified depiction in FIGS. 1A-B and FIGS. 2A-B, a number of important differences between power MOSFET packages and PIC packages are apparent. One difference is the PIC's increased number of electrical connections. Specifically, MOSFET devices typically include only three contacts, one to each of the source, drain, and gate. By contrast, PIC devices may feature more than three contacts, and often include a substantially greater number of contacts than three. The PIC devices also specifically include a Gnd contact on the upper die surface where the other contacts are positioned.

A second important difference between MOSFET and PIC devices is the role played by the bulk of the die. The MOSFET is a vertically conducting device, with the bulk of the die serving as the active drain component and the die bulk in active electrical contact with the supporting diepad, On the other hand, the PIC is a laterally conducting device, with the die bulk utilized as an insulating substrate between the active geometries built along the die surface. To ensure the bulk remains an insulator and cannot become forward biased and allow these active components to conduct between themselves or to other structures, not only is the substrate of FIGS. 2A-B, is secured in electrical contact with the leadframe diepad, diepad is downbonded from the Gnd bondpad on the surface of the die and thereby connected to an external Gnd connection via the integral leads.

One implication of the above-recited differences between conventional power MOSFET and PIC die packages is the ability to house power MOSFET die having a greater surface area in the same package. Specifically, electrical contact with the bulk of the power MOSFET die (the drain) can be established with the diepad solely through the die underside. By contrast, the presence of laterally conducting circuit elements in the PIC die requires that a separate downbond wire be connected between the Gnd bondpad and the diepad. This requires that space be allocated on the diepad adjacent to the expected die footprint to receive the downbond wire, thus taking away space from the diepad available to support the die.

This is illustrated in connection with FIG. 2A wherein PIC die 202 has a length Y of 1.09 mm and a width X of 0.916 mm, and diepad 204 has a length B of 1.44 mm and a width A of 1.066 mm. PIC package 200 of FIGS. 2A-B thus utilizes a lead frame area of 1.535 mm$^2$ to support a die area of 0.998 mm$^2$, a space efficiency utilization of 65%.

In accordance with embodiments of the present invention, efficiency in the utilization of space in a laterally-conducting semiconductor device package may be enhanced by specially creating a supplemental portion of the diepad that is designed to receive the downbond wire from the ground contact on the upper surface of the die. The supplemental downbond pad portion may occupy area at the end or side of the package. By receiving the downbond wire, the supplemental diepad portion frees up a greater area of the diepad to support a die having a larger area, thereby enhancing space efficiency.

Figure 3:
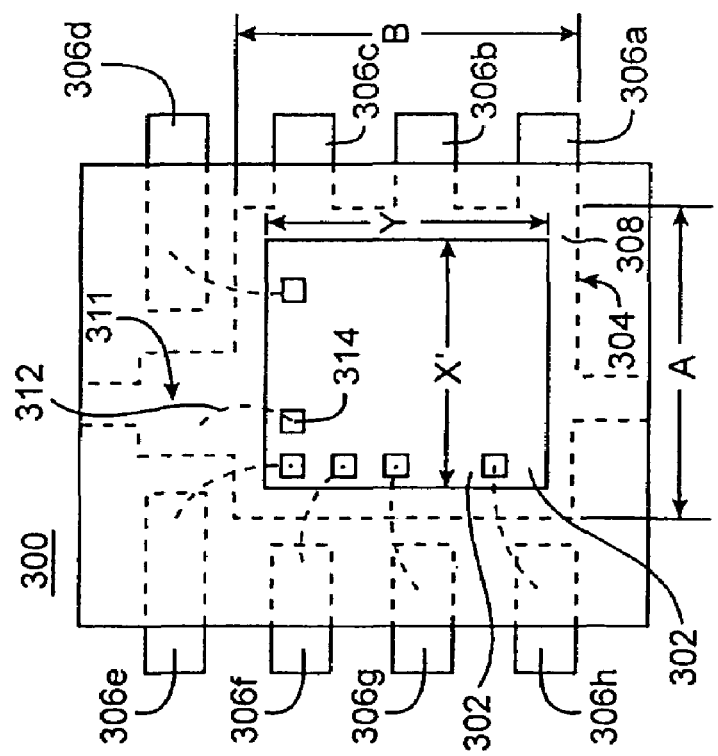
FIG. 3 is a simplified plan view of one embodiment of an eight-lead PIC package in accordance with the present invention.

FIG. 3 accordingly shows a simplified plan view of one embodiment of a PIC package in accordance with the present invention. Package 300 includes PIC die 302 positioned on lead frame 304. Like the conventional package of FIGS. 2A-B, lead frame 304 comprises three thermal dissipation leads 306a-c integral with diepad 308, and five electrical contact leads 306d-h that are not integral with diepad 308. Unlike the conventional package of FIGS. 2A-B, however, diepad 308 of lead frame 304 includes a supplemental downbond portion 311 integral with and projecting from the main diepad portion into space formerly occupied by non-integral diepad leads located at the end of the package, which have now been slightly shortened in length.

Downbond wire 312 extends from PIC Gnd contact 314 to supplemental downbond portion 311 of the diepad, freeing up space on the main portion of the diepad to support PIC die 302. Accordingly, PIC die 302 enclosed by package 300 of FIG. 3 is larger than the corresponding PIC die enclosed by the conventional PIC package of FIG. 2A. Specifically, diepad 308 of FIG. 3 having a length B of 1.44 mm and a width A of 1.066 mm (the same as in FIG. 2A) is able to support PIC die 302 having a length Y' of 1.29 mm and a width X' of 0.916 mm, a space efficiency utilization of 77%. This ability to enclose a larger die is not accompanied by any sacrifice in performance, as the electrical and thermal functionality of the pins of the package of FIG. 3 preserve those of the original package of FIG. 2A.

While the present invention has been described so far in connection with the specific PIC package shown in FIG. 3, the invention is not limited to this particular embodiment. For example, while the PIC package design of FIG. 3 shows a supplemental downbond portion being positioned at one end of the diepad, the supplemental downbond portion could be located in a different position, and the package design would remain within the scope of the present invention.

Figure 4A:
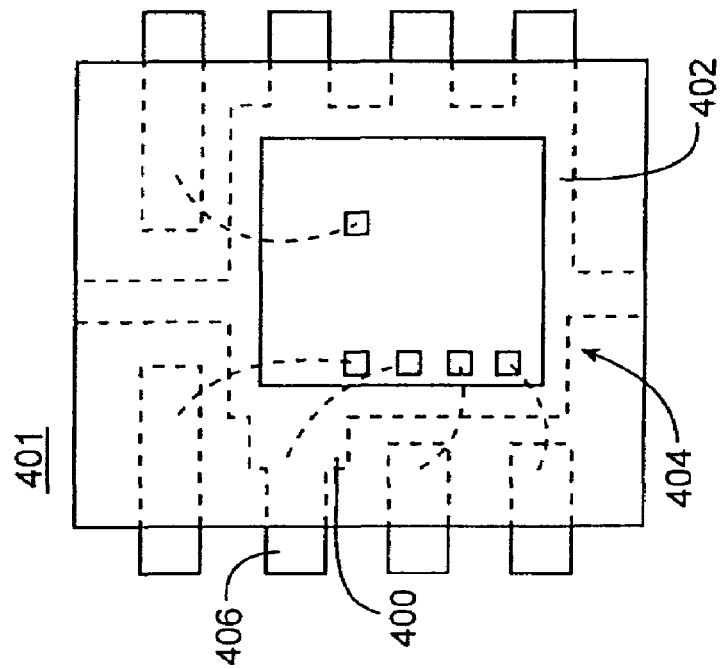
FIG. 4A is a simplified plan view of another embodiment of an eight-lead PIC package in accordance with the present invention.
Figure 4C:
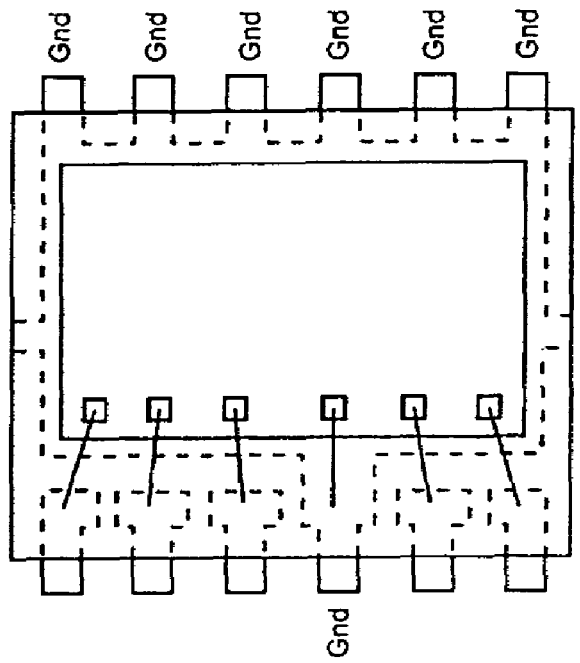
FIG. 4C is a simplified plan view of another embodiment of a twelve-lead package in accordance with the present invention.
Figure 4B:
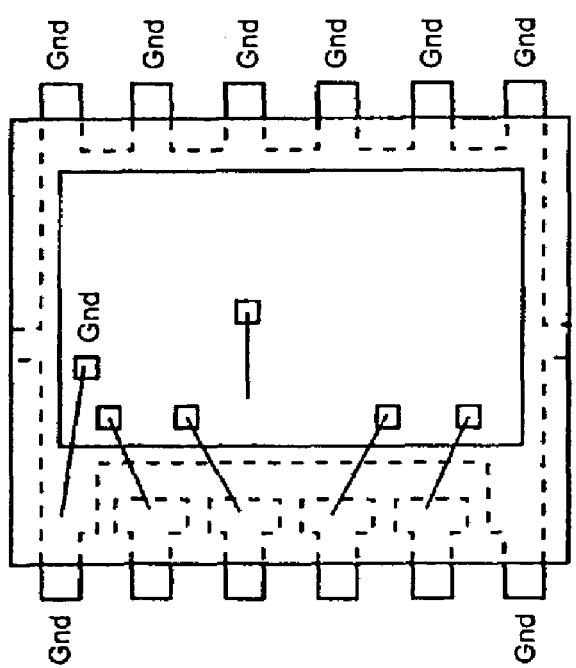
FIG. 4B is a simplified plan view of a embodiment of a twelve-lead package in accordance with the present invention.

FIG. 4A accordingly shows a simplified plan view of one such alternative embodiment of a package 401, wherein projecting supplemental downbond pad portion 400 of diepad 402 is positioned on the side, rather than at the end, of lead frame 404. Supplemental downbond pad region 400 is created by widening a base of a formerly integral lead 406 and causing it to become integral with the diepad. FIGS. 4B and 4C show simplified plan views of other embodiments of packages having the supplemental downbond pad portion present on the side of the die. In each case, the lead modified to incorporate the supplemental downbond pad portion would comprises a non-integral lead in the conventional package, as insufficient space is generally available present between the existing integral leads and the plastic package edge to permit any increase in integral lead size.

Figure 5:
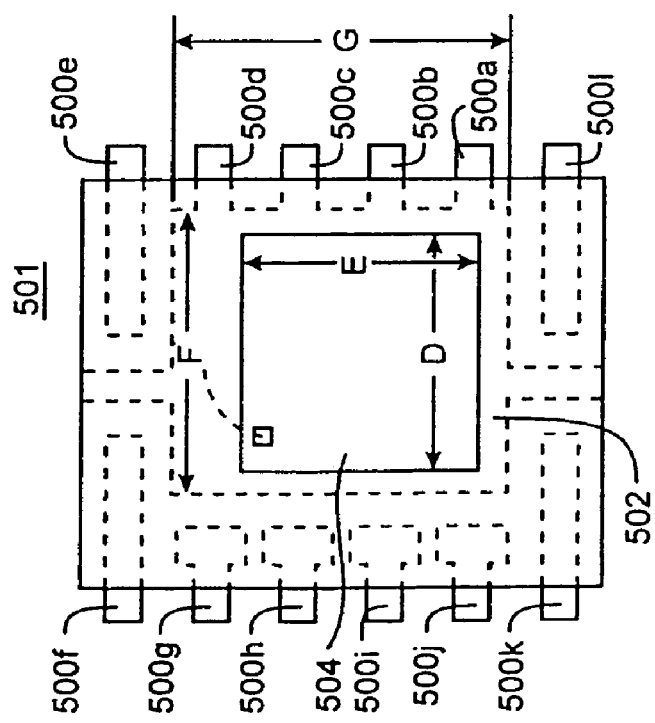
FIG. 5 is a simplified plan view of a conventional twelve-lead PIC package.
Figure 7:
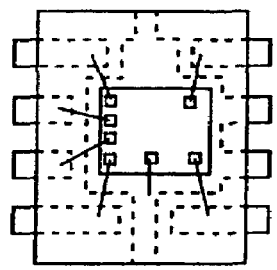
FIG. 7 is a simplified plan view of a conventional eight-lead package.
Figure 8:
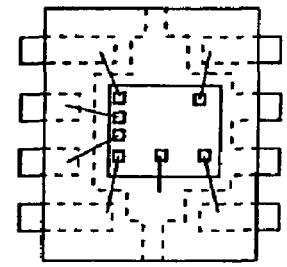
FIG. 8 is a simplified plan view of an alternative embodiment of an eight-lead package in accordance with the present invention.
Figure 9:
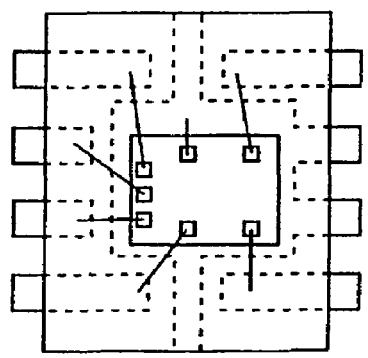
FIG. 9 is a simplified plan view of a conventional eight-lead package.
Figure 10:
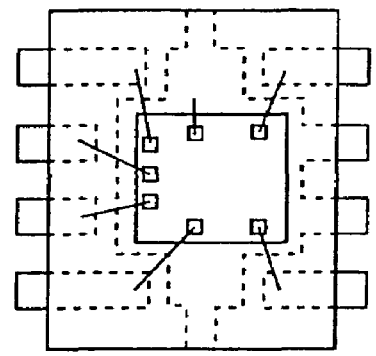
FIG. 10 is a simplified plan view of an alternative embodiment of an eight lead package in accordance with the present invention.
Figure 11:
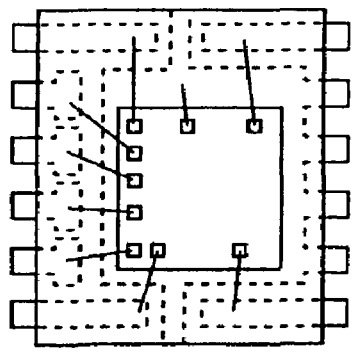
FIG. 11 is a simplified plan view of a conventional twelve-lead package.
Figure 12:
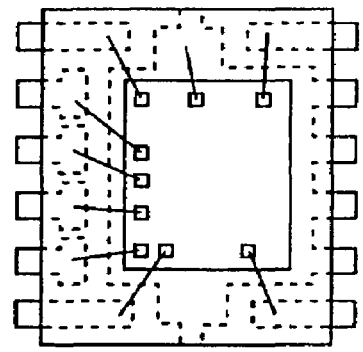
FIG. 12 is a simplified plan view of an alternative embodiment of a twelve lead package in accordance with the present invention.
Figure 13:
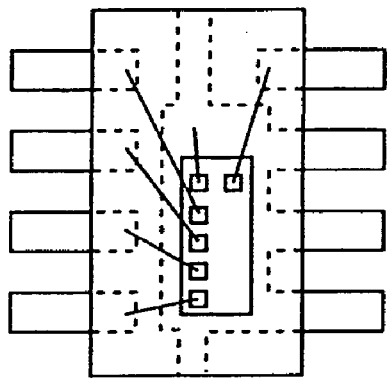
FIG. 13 is a simplified plan view of a conventional eight-lead package.
Figure 14:
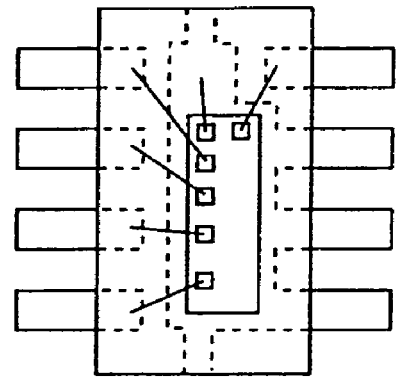
FIG. 14 is a simplified plan view of an alternative embodiment of an eight lead package in accordance with the present invention.
Figure 15:
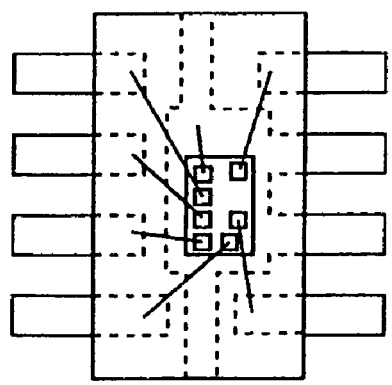
FIG. 15 is a simplified plan view of a conventional eight-lead package.
Figure 16:
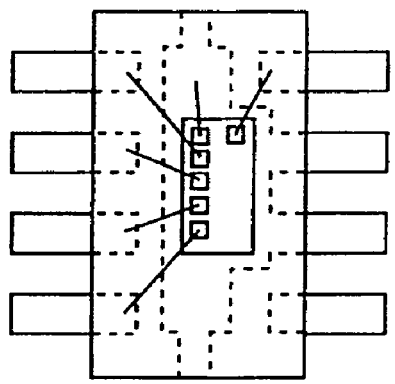
FIG. 16 is a simplified plan view of an alternative embodiment of an eight lead package in accordance with the present invention.

While the embodiments shown and described thus far illustrate packages having a single supplemental downbond pad portion, the present invention is not limited to this particular number. FIG. 5 shows a plan view of a conventional twelve-lead package 501 having four thermal dissipation leads 500a-d integral with diepad 502, and eight electrical contact leads 500e-l not integral with diepad 502. Conventional twelve lead package 501 houses PIC die 504 having a length E of 1.873 mm and width D of 1.47 mm on diepad 502 having length G of 2.225 mm and width F of 1.62 mm, resulting in a space efficiency utilization of about 74.6%.

Figure 6:
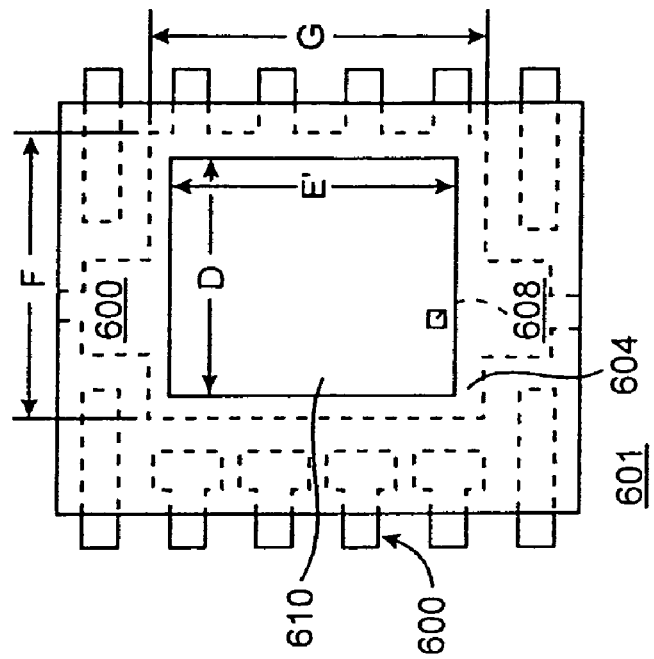
FIG. 6 is a simplified plan view of an embodiment of a twelve-lead PIC package in accordance with the present invention.

FIG. 6 shows a corresponding twelve lead package 601 in accordance with an alternative embodiment of the present invention. Lead frame 600 of package 601 features diepad 604 having two supplemental downbond portions 606 and 608 positioned at either end of the package. In the package shown in FIG. 6, PIC die 610 having a length E' of 2.073 mm and a width D' of 1.47 mm (die area 3.047 mm$^2$) is housed on a diepad 604 having the same dimensions as that of FIG. 5, resulting in an improved space efficiency of 84.5%.

The package shown in FIG. 6 offers advantages under at least two different circumstances. First, the package of FIG. 6 may enclose a die having a Gnd contact located at either end. Symmetry in the location of the supplemental downbond pad portions of the diepad would allow the same lead frame to be used to support a die having Gnd contacts located at either end, enhancing flexibility of the design.

In a second possible application, the lead frame of FIG. 6 may be used to support two separate die. In such a package, separate downbond wires connecting the Gnd bondpad to the respective downbond diepad portions would ensure a stable ground for the devices. Such an example assumes that the ground potential of the diepad would remain sufficiently stable during operation of both devices.

FIGS. 7-12 present simplified plan views of a number of conventional packages and corresponding packages in accordance with embodiments of the present invention. The following TABLE summarizes die and diepad dimensions, and space efficiencies, for these packages, as well as the packages discussed in connection with FIGS. 2A, 3, and 5-6. In this table, the diepad area refers to the area of the main portion supporting the die, and does not include the supplemental diepad portion of the packages in FIGS. 3, 6, 8, 10, 12, 14, and 16.

TABLE

| FIG. NO. | L × W = AREA OF DIEPAD (mm$^2$) | L × W = AREA OF DIE (mm$^2$) | SPACE EFFICIENCY (%) |
|---|---|---|---|
| 2A | 1.44 × 1.066 = 1.535 | 1.09 × 0.916 = 0.998 | 65.0 |
| 3 | 1.44 × 1.066 = 1.535 | 1.29 × 0.916 = 1.182 | 77.0 |
| 5 | 2.225 × 1.62 = 3.605 | 1.873 × 1.47 = 2.69 | 74.6 |
| 6 | 2.225 × 1.62 = 3.605 | 2.073 × 1.47 = 3.047 | 84.5 |
| 7 | 1.136 × 1.066 = 1.211 | 0.786 × 0.916 = 0.72 | 72.6 |
| 8 | 1.136 × 1.066 = 1.211 | 0.986 × 0.916 = 0.903 | 83.0 |
| 9 | 1.75 × 1.62 = 2.835 | 1.4 × 1.47 = 2.058 | 74.6 |
| 10 | 1.75 × 1.62 = 2.835 | 1.6 × 1.47 = 2.352 | 84.5 |
| 11 | 1.8 × 1.62 = 2.916 | 1.45 × 1.47 = 2.426 | 73.0 |
| 12 | 1.8 × 1.62 = 2.916 | 1.65 × 1.47 = 2.426 | 83.2 |
| 13 | 1.715 × 0.77 = 1.32 | 1.365 × 0.62 = 0.846 | 64.0 |
| 14 | 1.715 × 0.77 = 1.32 | 1.565 × 0.62 = 0.97 | 73.5 |
| 15 | 1.22 × 0.77 = 0.939 | 0.87 × 0.62 = 0.539 | 57.4 |
| 16 | 1.22 × 0.77 = 0.939 | 1.07 × 0.62 = 0.663 | 70.6 |

The above TABLE also includes dimensions of packages shown in FIGS. 13-16. The packages of FIGS. 13-16 show various conventional TSOP-8 packages, along with corresponding packages in accordance with embodiments of the present invention.

While the above description has illustrated embodiments of packages for housing power IC devices, the present invention is not limited to this particular application. Packages in accordance with embodiments of the present invention could also be utilized to house other laterally-conducting power and non-power dies, including but not limited to junction field effect transistors (JFETs) or lateral MOSFET devices, utilizing a supplemental diepad position.

Finally, while the above description has illustrated embodiments in accordance with the present invention supporting packages having eight or twelve leads, the present invention is not limited to packages having this or any specific number of leads, or to packages enclosing dies of any particular size or contact orientation.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method of packaging a laterally conducting semiconductor die, the method comprising providing a supplemental diepad portion on an end of the package between two leads separate from the diepad to receive a downbond wire from a ground contact on an upper surface of the die, such that area of a main portion of the diepad need not be allocated to receive the downbond wire and can instead be occupied by the laterally conducting die.

2. The method of claim 1 wherein the leadframe supports a power IC die.

3. The method of claim 1 further comprising providing more than one supplemental diepad portion.

4. The method of claim 1 wherein the leadframe supports a die operated with a current of between about 1 to 20 Amps.

5. The method of claim 1 wherein the leadframe supports a die selected from the group consisting of an IC, a lateral MOSFET, and a JFET.

\* \* \* \* \*